US011355951B2

(12) United States Patent
Yen et al.

(10) Patent No.: US 11,355,951 B2
(45) Date of Patent: Jun. 7, 2022

(54) POWER FAILURE PREVENTION SYSTEM

(71) Applicant: ANPEC ELECTRONICS CORPORATION, Hsinchu (TW)

(72) Inventors: Tzu-Yang Yen, Taipei (TW); Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 333 days.

(21) Appl. No.: 16/785,700

(22) Filed: Feb. 10, 2020

(65) Prior Publication Data

US 2021/0159720 A1    May 27, 2021

(30) Foreign Application Priority Data

Nov. 21, 2019   (TW) ................................. 108142302

(51) Int. Cl.
*H02J 7/34* (2006.01)
*H02J 7/00* (2006.01)
*H02M 3/07* (2006.01)

(52) U.S. Cl.
CPC ............ *H02J 7/345* (2013.01); *H02J 7/0013* (2013.01); *H02M 3/07* (2013.01)

(58) Field of Classification Search
CPC ..................................................... H02J 7/345
See application file for complete search history.

(56) References Cited

U.S. PATENT DOCUMENTS 10,135,334 B1 *  11/2018  Vinciarelli ............ H02M 1/083
2017/0207703 A1 *  7/2017  Houston ............. H02M 3/1582

FOREIGN PATENT DOCUMENTS

TW      201703410 A    1/2017
TW      201720031 A    6/2017

* cited by examiner

*Primary Examiner* — Robert Grant
(74) *Attorney, Agent, or Firm* — Li & Cai Intellectual Property (USA) Office

(57) ABSTRACT

A power failure prevention system includes a switch circuit, an energy storage circuit, a voltage detector circuit and a control circuit. The switch circuit includes a first switch, a second switch, a third switch and a fourth switch. The energy storage circuit is connected to the switch circuit. The voltage detector circuit detects an input voltage provided by an input voltage source and a stored voltage of the energy storage circuit. The control circuit controls the switch circuit according to the detected input voltage and stored voltage. When the input voltage is higher than a first threshold, the switch circuit allows the input voltage to charge the energy storage circuit. When the input voltage is lower than a second threshold, the switch circuit allows the stored voltage to discharge to the input voltage source. The first threshold is higher than the second threshold.

11 Claims, 8 Drawing Sheets

POWER FAILURE PREVENTION SYSTEM

CROSS-REFERENCE TO RELATED PATENT APPLICATION

This application claims the benefit of priority to Taiwan Patent Application No. 108142302, filed on Nov. 21, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power failure prevention system, and more particularly to a power failure prevention system for a solid state storage device.

BACKGROUND OF THE DISCLOSURE

With the development of power application technologies, more and more electronic devices that require electric power for operation have been developed, so that more and more electric power is demanded by people. However, whenever the power is abnormally powered down, people's lives are subjected to shock and inconvenience. Once a power supply in a factory production line or other applications is interrupted, significant financial losses may be suffered by a manufacturer or a user.

SUMMARY OF THE DISCLOSURE

In response to the above-referenced technical inadequacies, the present disclosure provides a power failure prevention system, which includes a switch circuit, an energy storage circuit, a voltage detector circuit and a control circuit. The switch circuit includes a first switch, a second switch, a third switch and a fourth switch. A first terminal of the first switch is connected to an input voltage source. A second terminal of the first switch is connected to a first terminal of the second switch. A second terminal of the second switch is grounded. A node between the first switch and the second switch is connected to a node between the third switch and the fourth switch through an inductor. The energy storage circuit is connected to a first terminal of the third switch. A second terminal of the third switch is connected to a first terminal of the fourth switch. A second terminal of the fourth switch is grounded. The voltage detector circuit is connected to the input voltage source and the energy storage circuit. The voltage detector circuit is configured to detect an input voltage provided by the input voltage source and a stored voltage of the energy storage circuit. The control circuit is connected to the voltage detector circuit and control terminals of the switch circuit. The control circuit is configured to switch the switch circuit between a plurality of modes including a buck mode, a buck-boost mode and a boost mode according to the input voltage and the stored voltage. In each of the modes, when the input voltage is higher than a first threshold, the switch circuit allows the input voltage to charge the energy storage circuit. In each of the modes, when the input voltage is lower than a second threshold, the switch circuit allows the stored voltage to discharge to the input voltage source. The first threshold is higher than the second threshold.

In certain embodiments, in a process of discharging the stored voltage to the input voltage source, when the stored voltage is higher than the input voltage and a difference between the stored voltage and the input voltage is higher than a first difference threshold, the control circuit controls the switch circuit to operate in the buck mode. In the buck mode, the control circuit turns on the first switch, turns off the second switch, and complementarily switches the third switch and the fourth switch according to a duty ratio of the input voltage to the stored voltage.

In certain embodiments, in the process of discharging the stored voltage to the input voltage source, when the stored voltage is higher than, equal to or lower than the input voltage, and the difference between the stored voltage and the input voltage is lower than the first difference threshold and lower than a second difference threshold, the control circuit controls the switch circuit to operate in the buck-boost mode. In the buck-boost mode, the control circuit complementarily switches the first switch, the second switch, the third switch and the fourth switch according to the duty ratio of the input voltage to the stored voltage.

In certain embodiments, in the process of discharging the stored voltage to the input voltage source, when the input voltage is higher than the stored voltage and the difference between the stored voltage and the input voltage is higher than the second difference threshold, the control circuit controls the switch circuit to operate in the boost mode. In the boost mode, the control circuit turns on the third switch, turns off the fourth switch, and complementarily switches the first switch and the second switch according to the duty ratio of the input voltage to the stored voltage.

In certain embodiments, in a process of charging the energy storage circuit by the input voltage, when the input voltage is lower than the stored voltage, and a difference between the stored voltage and the input voltage is higher than a first difference threshold, the control circuit controls the switch circuit to operate in the boost mode. In the boost mode, the control circuit turns on the third switch, turns off the fourth switch, and complementarily switches the first switch and the second switch according to a duty ratio of the input voltage to the stored voltage.

In certain embodiments, in the process of charging the energy storage circuit by the input voltage, when the input voltage is higher than, equal to or lower than the stored voltage, and the difference between the stored voltage and the input voltage is lower than the first difference threshold and lower than a second difference threshold, the control circuit controls the switch circuit to operate in the buck-boost mode. In the buck-boost mode, the control circuit complementarily switches the first switch, the second switch, the third switch and the fourth switch according to the duty ratio of the input voltage to the stored voltage.

In certain embodiments, in the process of charging the energy storage circuit by the input voltage, when the input voltage is higher than the stored voltage, and the difference between the stored voltage and the input voltage is higher than the second difference threshold, the control circuit controls the switch circuit to operate in the buck mode. In the buck mode, the control circuit turns on the first switch, turns off the second switch, and complementarily switches the third switch and the fourth switch according to the duty ratio of the input voltage to the stored voltage.

In certain embodiments, the energy storage circuit includes a plurality of capacitors connected in parallel with each other, one of each of the capacitors is connected to the first terminal of the third switch, and another terminal of each of the capacitors is grounded.

In certain embodiments, the power failure prevention system further includes an input capacitor connected to a node between the input voltage source and the first terminal of the first switch.

In certain embodiments, the power failure prevention system further includes a voltage divider circuit connected to the input voltage source and the voltage detector circuit, and configured to divide the input voltage.

In certain embodiments, the power failure prevention system further includes a voltage divider circuit connected to the first terminal of the third switch and the voltage detector circuit, and configured to divide the stored voltage.

As described above, the present disclosure provides the power failure prevention system, which can perform a bi-directional operation of charging and discharging in the buck mode, the buck-boost mode and the boost mode. In particular, when the storage voltage of the energy storage circuit is lower than the input voltage of the input voltage source, the input voltage still can be maintained. When the input voltage source can normally supply power, the input voltage source charges the energy storage circuit used as the backup power supply device. When the power is abnormally powered down in any of the above-mentioned modes, the energy storage circuit is used to provide the stored voltage to the input voltage source such that the input voltage source can supply the power to circuit components. In particular, the power is supplied to the circuit components that are executing programs when the power is abnormally powered down. For example, the power is supplied to a solid state storage device that is accessing data when the power is abnormally powered down. As a result, the circuit components obtaining the backup power can use the stored voltage to execute unfinished programs. Therefore, the power failure prevention system of the present disclosure can prevent a power failure from causing errors in the programs. When no error occurs in the programs, the programs do not need to be re-executed after a period of time when the power is finally restored.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
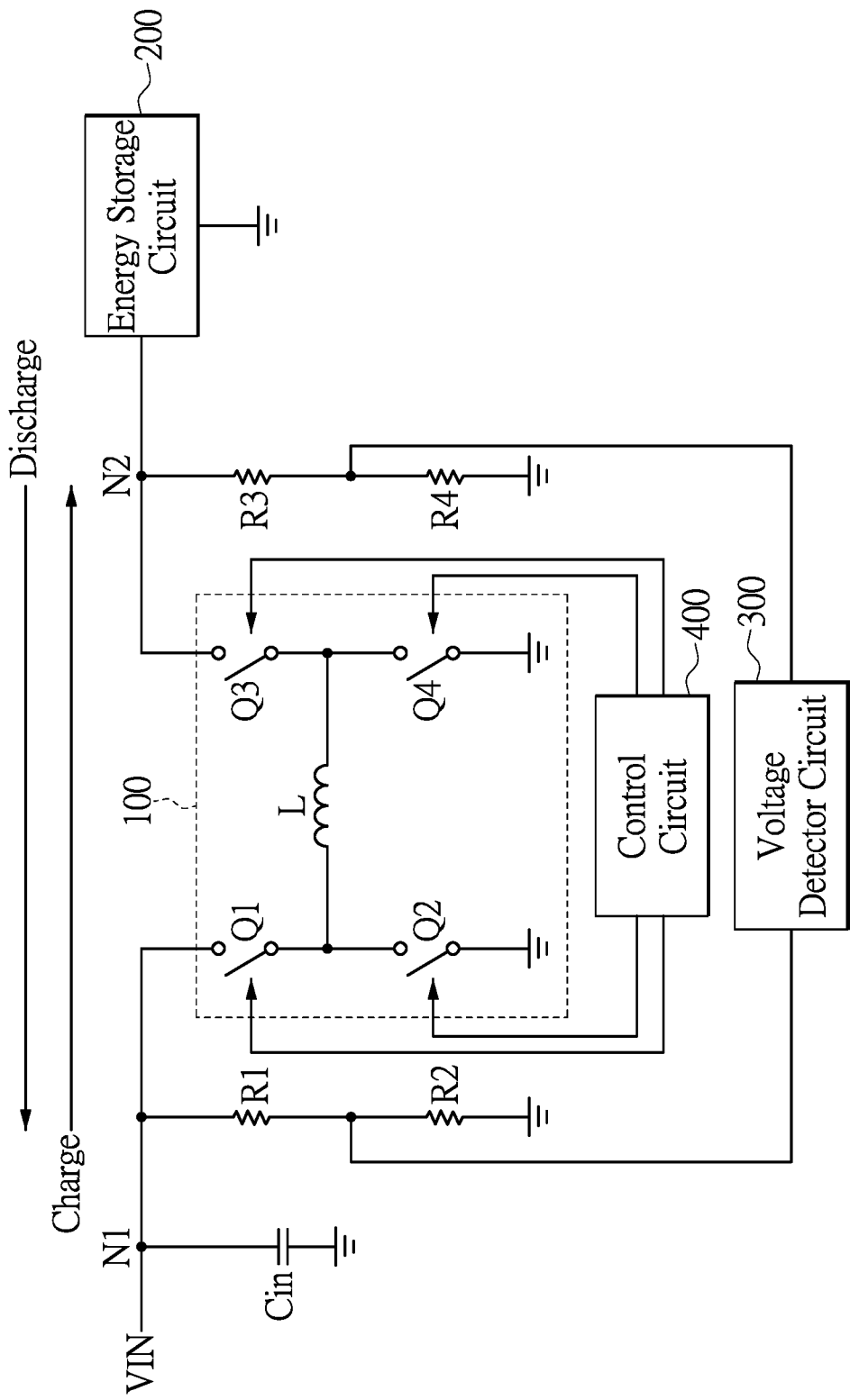
FIG. 1 is a circuit layout diagram of a power failure prevention system according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of a power failure prevention system according to an embodiment of the present disclosure. As shown in FIG. 1, in the embodiment, the power failure prevention system includes a switch circuit 100, an energy storage circuit 200, a voltage detector circuit 300 and a control circuit 400.

The energy storage circuit 200 is used as a backup power source or a backup power supply device of an input voltage source. When the input voltage source is powered down, the energy storage circuit 200 is used. When the energy storage circuit 200 normally supplies an input voltage VIN to charge the energy storage circuit 200, the energy storage circuit 200 stores a stored voltage as a backup power of the input voltage VIN. When the input voltage source is powered down and cannot supply the input voltage VIN, the energy storage circuit 200 supplies the stored voltage. The input voltage source is used to charge the energy storage circuit 200. For example, the input voltage source may a USB of 5V, an adapter of 19V or other input voltage sources that can supply higher voltages.

The switch circuit 100 is connected between the input voltage source and the energy storage circuit 200. The switch circuit 100 includes a first switch Q1, a second switch Q2, a third switch Q3 and a fourth switch Q4. A first terminal of the first switch Q1 is connected to the input voltage source. The input voltage source is connected to a node N1. In other words, the first terminal of the first switch Q1 is connected to the node N1 between the input voltage source and the switch circuit 100. A second terminal of the first switch Q1 is connected to a first terminal of the second switch Q2. A second terminal of the second switch Q2 is grounded.

A node between the first switch Q1 and the second switch Q2 is connected to a node between the third switch Q3 and the fourth switch Q4 through an inductor L. A first terminal of the third switch Q3 is connected to the energy storage circuit 200. In other words, the first terminal of the third switch Q3 is connected to a node N2 between the switch circuit 100 and the energy storage circuit 200. A second terminal of the third switch Q3 is connected to a first terminal of the fourth switch Q4. A second terminal of the fourth switch Q4 is grounded.

The input voltage source may provide the input voltage VIN to charge an input capacitor Cin. As a result, in a normal power supply mode, the input capacitor Cin discharges such that the energy storage circuit 200 is charged to have the stored voltage. When the input voltage source is powered down or removed and cannot provide the input voltage VIN, the energy storage circuit 200 discharges. A discharge current of the energy storage circuit 200 flows to the input voltage source through the switch circuit 100 such that the input voltage source or the input capacitor Cin has a target voltage such as the input voltage VIN.

The voltage detector circuit 300 is connected to the input voltage source and the energy storage circuit 200. In a process of charging the energy storage circuit 200 by the input voltage source or a process of discharging the energy storage circuit 200 to the input voltage source, the voltage detector circuit 300 may detect the input voltage VIN of the input voltage source such as a voltage of the node N1, and detect the stored voltage of the energy storage circuit 200 such as a voltage of the node N2.

Optionally, a first voltage divider circuit is disposed between the voltage detector circuit 300 and the input voltage source. The first voltage divider circuit may include a first resistor R1 and a second resistor R2. The voltage detector circuit 300 is connected to a node between the first resistor R1 and the second resistor R2. The voltage detector circuit 300 detects the node between the first resistor R1 and the second resistor R2 to obtain a voltage, which is divided from the input voltage VIN of the input voltage source such as the voltage of the node N1.

Optionally, a second voltage divider circuit is disposed between the voltage detector circuit 300 and the energy storage circuit 200. The second voltage divider circuit may include a third resistance R3 and a fourth resistance R4. The voltage detector circuit 300 is connected to a node between the third resistor R3 and the fourth resistor R4. The voltage detector circuit 300 detects the node between the third resistor R3 and the fourth resistor R4 to obtain a voltage, which is divided from the stored voltage of the energy storage circuit 200 such as the voltage of the node N2.

The control circuit 400 is connected to the voltage detector circuit 300, and control terminals of the first switch Q1, the second switch Q2, the third switch Q3 and the fourth switch Q4 of the switch circuit 100. The control circuit 400 is configured to turn on or off the switch circuit 100 according to the input voltage VIN of the input voltage source and the stored voltage of the energy storage circuit 200 that are detected by the voltage detector circuit 300.

The control circuit 400 controls the switch circuit 100 to allow the input voltage source to provide the input voltage VIN to charge the energy storage circuit 200. Alternatively, the control circuit 400 controls the switch circuit 100 to allow the stored voltage of the energy storage circuit 200 to discharge to the energy storage circuit 200.

Figure 2:
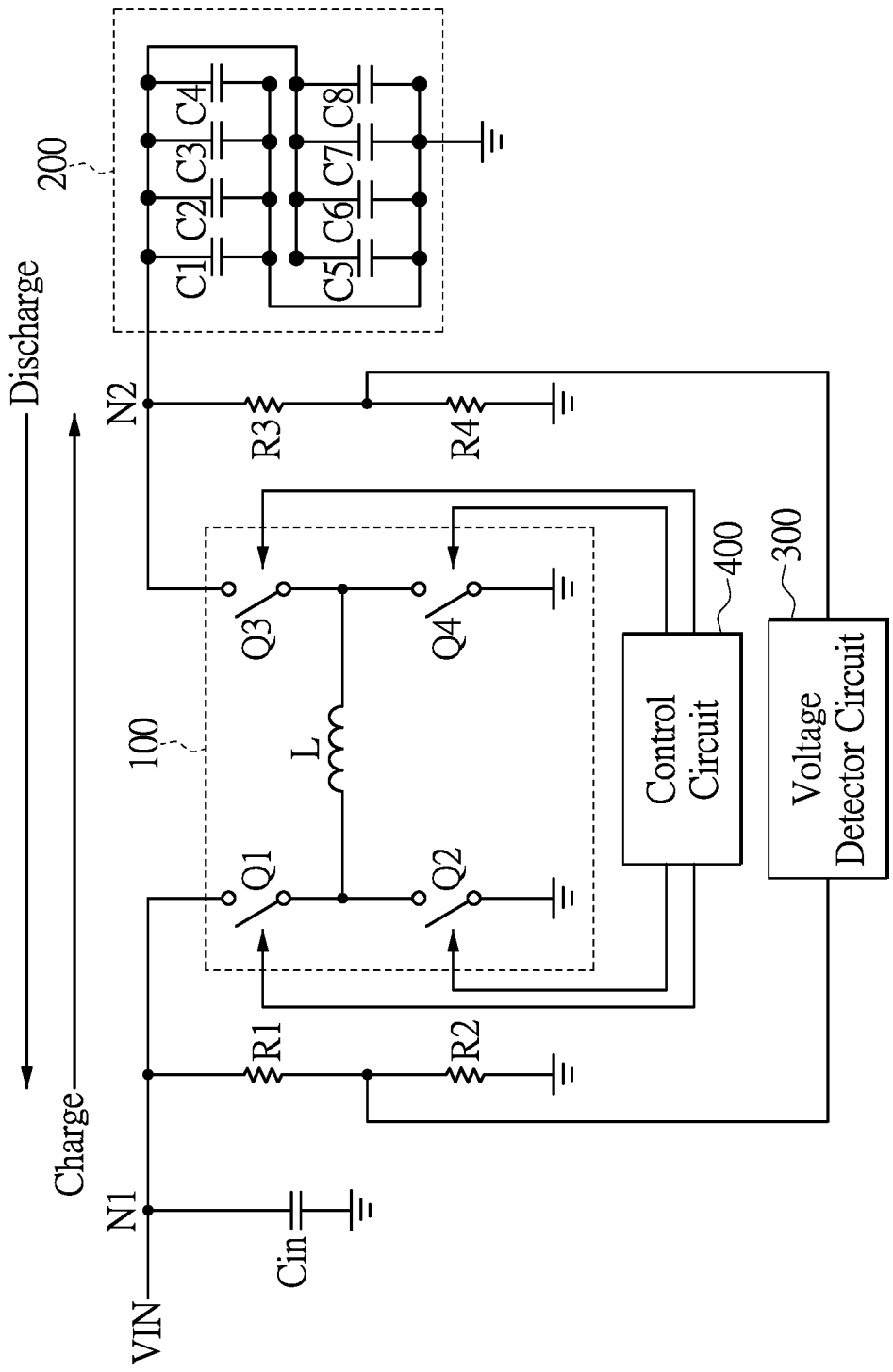
FIG. 2 is a detailed circuit layout diagram of the power failure prevention system according to the embodiment of the present disclosure.

Reference is made to FIG. 2, which is a detailed circuit layout diagram of the power failure prevention system according to the embodiment of the present disclosure. The same descriptions of the embodiment of FIGS. 1 and 2 are not repeated here. As shown in FIG. 2, the energy storage circuit 200 may include one or more capacitors. In the embodiment, the energy storage circuit 200 includes a plurality of capacitors C1 to C8, which may be made of various voltage-resistant materials, but the present disclosure is not limited thereto. The capacitors C1 to C8 are connected in parallel to each other. One terminal of each of the capacitors C1 to C8 is connected to the first terminal of the third switch Q3 of the switch circuit 100. That is, the one terminal of each of the capacitors C1 to C8 is connected to the node N2. Another terminal of each of the capacitors C1 to C8 is grounded. The voltage at the node N2 is compatible with various capacitors.

Figure 3:
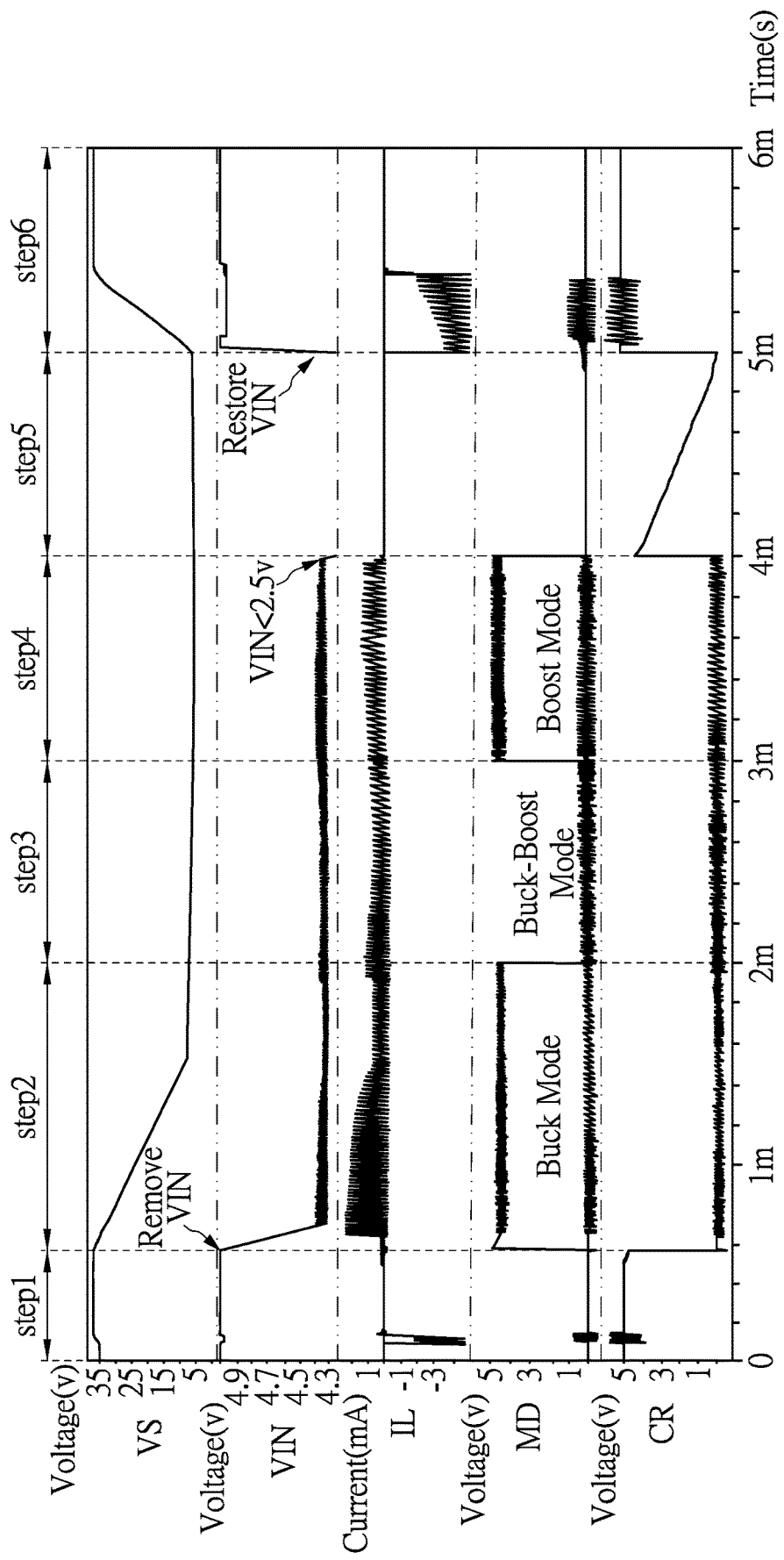
FIG. 3 is a waveform diagram of signals of the power failure prevention system in a boost mode, a buck-boost mode, a buck mode and a shutdown mode according to the embodiment of the present disclosure.
Figure 4:
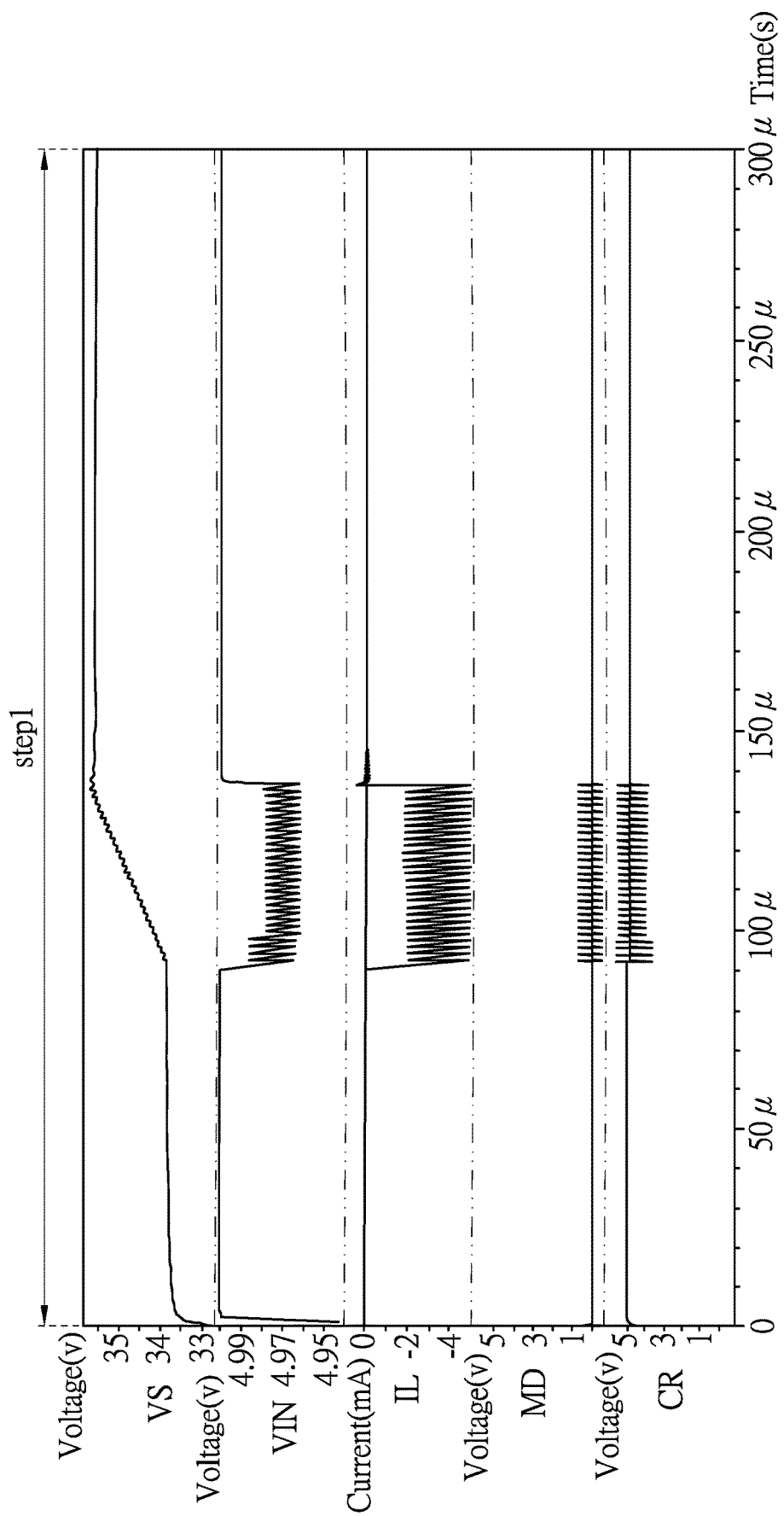
FIG. 4 is a waveform diagram of signals of the power failure prevention system in the boost mode according to the embodiment of the present disclosure.

Reference is made to FIGS. 2 to 4, wherein FIG. 3 is a waveform diagram of signals of the power failure prevention system in a boost mode, a buck-boost mode, a buck mode and a shutdown mode according to the embodiment of the present disclosure, and FIG. 4 is a waveform diagram of signals of the power failure prevention system in the boost mode according to the embodiment of the present disclosure.

As shown in FIG. 3, in the embodiment, switching operations of the switch module of the power failure prevention system may be divided into six-stage processes step 1 to step 6, which may be performed sequentially and repeatedly.

First, the control circuit 400 shown in FIG. 1 may preset a first threshold and a second threshold as a condition of switching the switch circuit 100.

When the control circuit 400 determines that the input voltage VIN of the input voltage source such as 5V is higher than the first threshold, the control circuit 400 controls the switch circuit 100 to allow the input voltage VIN to charge the energy storage circuit 200. Alternatively, when the control circuit 400 determines that the input voltage VIN is divided to a voltage at the node between the first resistor R1 and the second resistor R2, and the divided voltage is higher than the first threshold, the control circuit 400 controls the switch circuit 100 to allow the input voltage VIN to charge the energy storage circuit 200. At this time, a charge/discharge instructing signal CR shown in FIG. 3 is at a high level, which instructs that the input voltage VIN charges the energy storage circuit 200.

As shown in FIG. 4, in the process of charging the energy storage circuit 200 by the input voltage VIN, when the input voltage VIN is lower than the stored voltage VS, and a difference between the stored voltage VS and the input voltage VIN is higher than a first difference threshold (that is, the stored voltage VS is much higher than the input voltage VIN), the control circuit 400 controls the switch circuit 100 to operate in the boost mode of the first stage process step 1. In the boost mode of the first stage process step 1, the control circuit 400 shown in FIG. 2 turns on the third switch Q3 and turns off the fourth switch Q4, and complementarily switches the first switch Q1 and the second switch Q2 according to a duty ratio of the input voltage VIN to the stored voltage VS. At this time, the switch circuit 100 allows the input voltage source to provide the input voltage VIN to charge the energy storage circuit 200 to have the stored voltage VS such as 35V shown in FIG. 4.

When the input voltage source or the input capacitor Cin provides the input voltage VIN to charge the energy storage circuit 200, the stored voltage VS of the energy storage circuit 200 gradually increases, and the input voltage VIN of the input voltage source and a current IL of the inductor L shown in FIG. 1 decrease.

Figure 5:
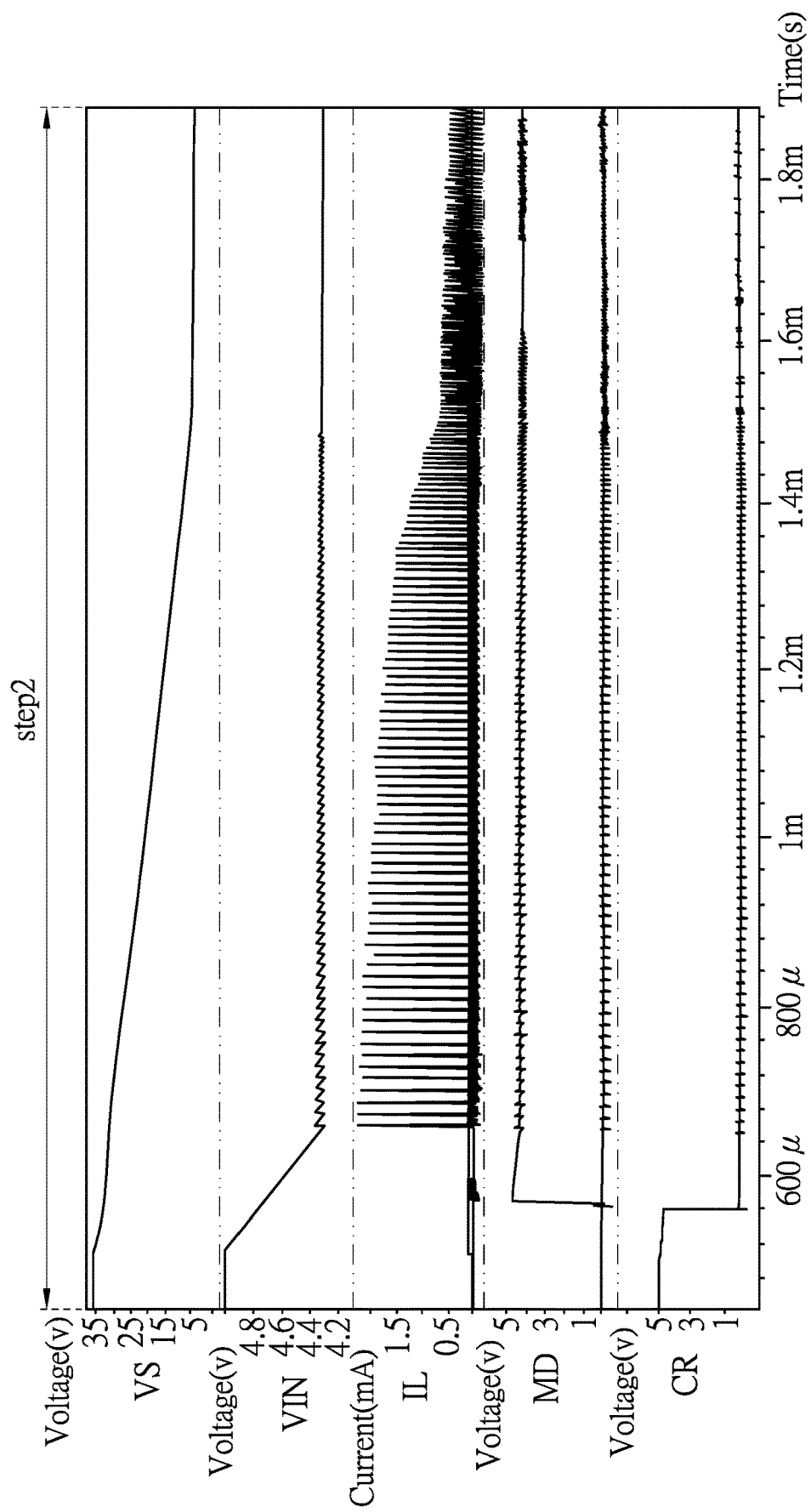
FIG. 5 is a waveform diagram of signals of the power failure prevention system in the buck mode according to the embodiment of the present disclosure.

Reference is made to FIGS. 2 to 5, wherein FIG. 3 is the waveform diagram of signals of the power failure prevention system in the boost mode, the buck-boost mode, the buck mode and the shutdown mode according to the embodiment of the present disclosure, and FIG. 5 is a waveform diagram of signals of the power failure prevention system in the buck mode according to the embodiment of the present disclosure.

When the voltage detector circuit 300 detects that the input voltage VIN of the input voltage source or the input capacitor Cin is lower than the second threshold such as the stored voltage VS, the control circuit 400 controls the switch circuit 100 to allow the stored voltage VS to discharge to the input voltage source. Alternatively, when the voltage detector circuit 300 detects that a voltage that is generated by dividing the input voltage VIN by a first voltage divider circuit at a node between the first resistor R1 and the second resistor R2 is lower than the second threshold, the control circuit 400 controls the switch circuit 100 to allow the stored voltage VS to discharge to the input voltage source. At this time, a mode switching signal MD shown in FIG. 3 changes from a low level to a high level, and the charge/discharge instructing signal CR is at a low level, which represents that (a load) of the power failure prevention system is releasing energy.

As shown in FIG. 5, in a process of discharging the stored voltage VS to the input voltage source, when the input voltage VIN of the input voltage source is lower than the stored voltage VS, and the difference between the stored voltage VS and the input voltage VIN is higher than the first difference threshold (that is the stored voltage VS is much higher than the input voltage VIN), the control circuit 400 controls the switch circuit 100 to operate in the buck mode of the second stage process step 2.

Conversely, in practice, when the voltage detector circuit 300 detects that the input voltage VIN of the input voltage source or the input capacitor Cin, or the divided voltage of the input voltage VIN is higher than the first threshold, the control circuit 400 controls the switch circuit 100 to allow the input voltage VIN to charge the energy storage circuit 200. In the process of charging the energy storage circuit 200 by the input voltage VIN, when the input voltage VIN is higher than the stored voltage VS, and the difference between the stored voltage VS and the input voltage VIN is higher than a second difference threshold (that is, the stored voltage VS is much lower than the input voltage VIN), the control circuit 400 controls the switch circuit 100 to operate in the buck mode.

In the buck mode, the control circuit 400 shown in FIG. 2 turns on the first switch Q1, turns off the second switch Q2, and complementarily switches the third switch Q3 and the fourth switch Q4 according to the duty ratio of the input voltage Vin to the stored voltage VS. At this time, the energy storage circuit 200 and the inductor L shown in FIG. 2 discharge to the input voltage source such that the stored voltage VS of the energy storage circuit 200 and the inductor IL of the inductor L decrease as shown in FIG. 5.

Figure 6:
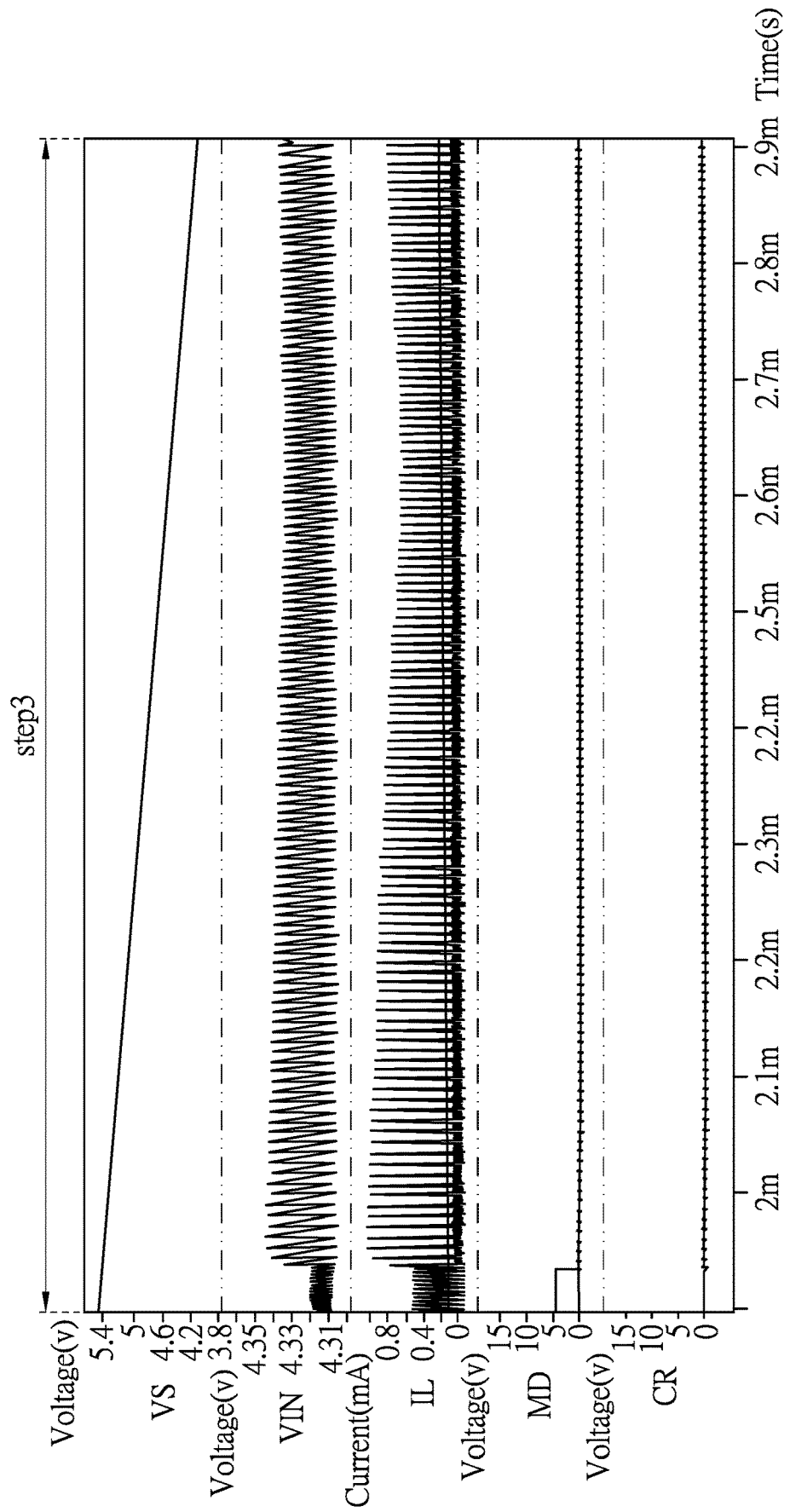
FIG. 6 is a waveform diagram of signals of the power failure prevention system in the buck-boost mode according to the embodiment of the present disclosure.

Reference is made to FIGS. 2 to 6, wherein FIG. 6 is a waveform diagram of signals of the power failure prevention system in the buck-boost mode according to the embodiment of the present disclosure.

When the voltage detector circuit 300 detects that the input voltage VIN of the input voltage source or the input capacitor Cin is lower than the second threshold such as the stored voltage VS, the control circuit 400 controls the switch circuit 100 to allow the stored voltage VS to discharge to the input voltage source. Alternatively, the voltage detector circuit 300 detects that a voltage that is generated by dividing the input voltage VIN at the node between the first resistor R1 and the second resistor R2 is lower than the second threshold, the control circuit 400 controls the switch circuit 100 to allow the stored voltage VS to discharge to the input voltage source.

As shown in FIG. 6, in the process of discharging the stored voltage VS to the input voltage source, when the input voltage VIN is higher than, equal to or lower than the stored voltage VS, and the difference between the stored voltage VS and the input voltage VIN is lower than the first difference threshold and lower than the second difference threshold (that is, the input voltage VIN is close to the stored voltage VS), the control circuit 400 controls the switch circuit 100 to operate in the buck-boost mode of the third stage process step 3. As shown in FIG. 3, the mode switching signal MD is at a low level, which represents that the power failure prevention system is in the buck-boost mode. The charge/discharge instructing signal CR is at a low level, which represents that (the load) of the power failure prevention system is releasing energy.

In the third stage process step 3, the energy storage circuit 200 discharges to the input voltage source through the inductor L, such that the stored voltage VS of the energy storage circuit 200 gradually decreases, the input voltage VIN of the input voltage source gradually increases, and the current IL of the inductor L gradually decreases and then gradually increases. As a result, the stored voltage VS of the energy storage circuit 200 is higher than or equal to the input voltage VIN of the input voltage source.

Conversely, in practice, in the process of charging the stored voltage VS by the input voltage VIN, when the input voltage VIN is higher than, equal to or lower than the stored voltage VS, and the difference between the stored voltage VS and the input voltage VIN is lower than the first difference threshold and lower than the second difference threshold (that is, the input voltage VIN is close to the stored voltage VS), the control circuit 400 controls the switch circuit 100 to operate in the buck-boost mode.

In buck-boost mode, the control circuit 400 shown in FIG. 2 complementarily switches the first switch Q1, the second switch Q2, the third switch Q3 and the fourth switch Q4 according to the duty ratio of the input voltage VIN to the stored voltage VS.

Figure 7:
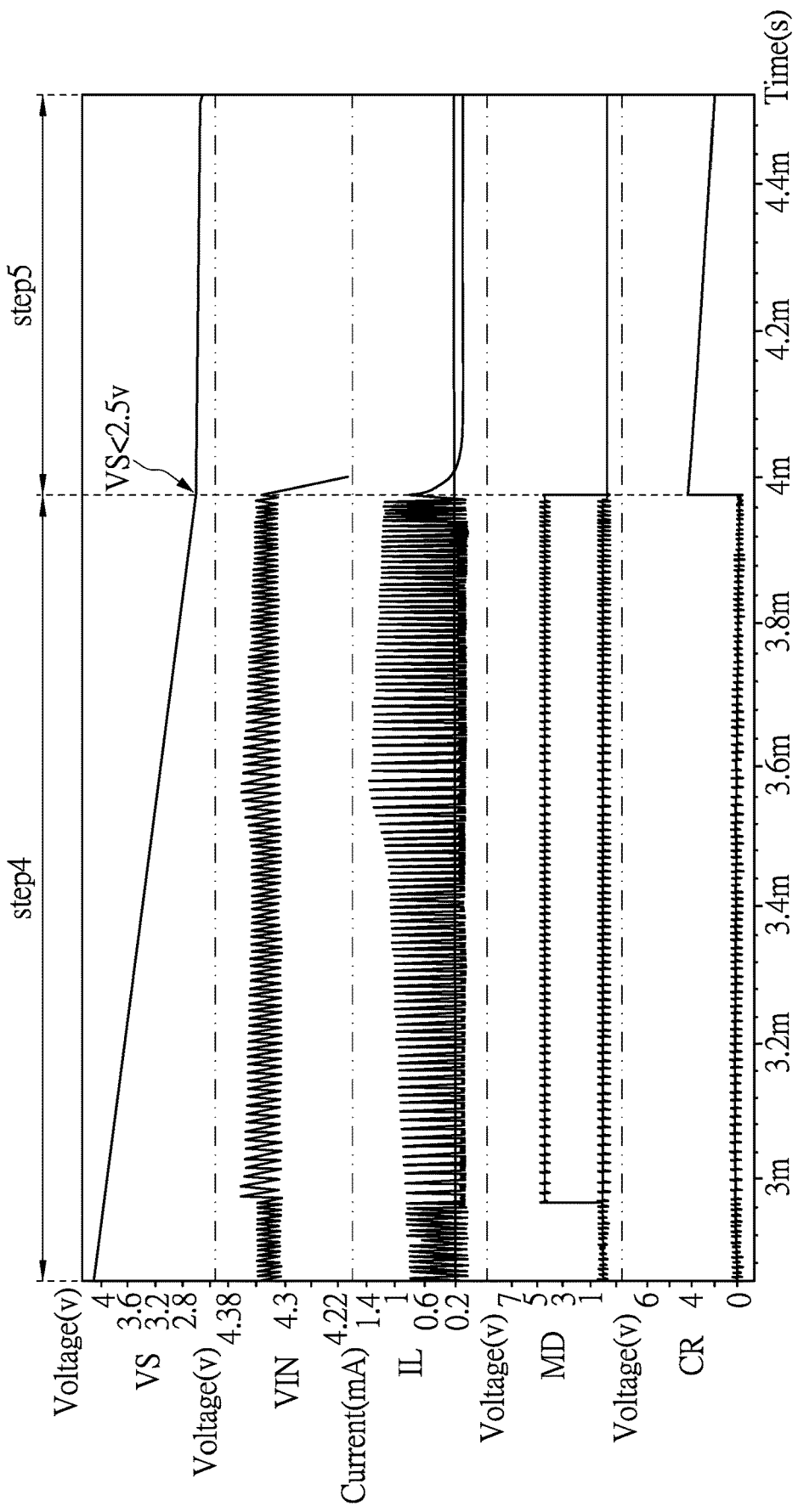
FIG. 7 is a waveform diagram of signals of the power failure prevention system in the boost mode and the shutdown mode according to the embodiment of the present disclosure.
Figure 8:
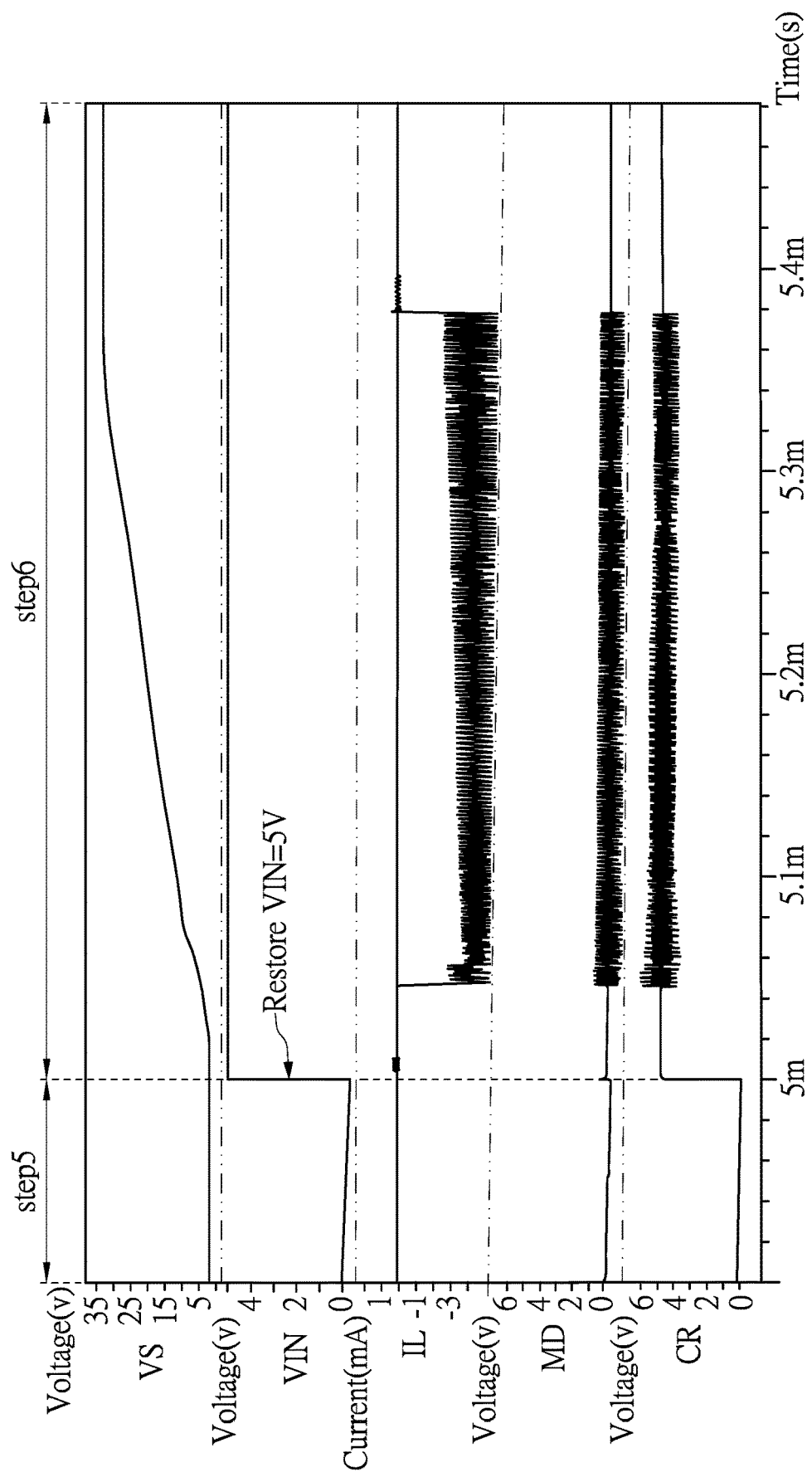
FIG. 8 is a waveform diagram of signals of the power failure prevention system in the boost mode according to the embodiment of the present disclosure.

Reference is made to FIGS. 2 to 8, wherein FIG. 7 is a waveform diagram of signals of the power failure prevention system in the boost mode and the shutdown mode according to the embodiment of the present disclosure, and FIG. 8 is a waveform diagram of signals of the power failure prevention system in the boost mode according to the embodiment of the present disclosure.

When the voltage detector circuit 300 detects that the input voltage VIN of the input voltage source or the input capacitor Cin, or a divided voltage of the input voltage VIN at the node between the first resistor R1 and the second resistor R2, is lower than the second threshold, the control circuit 400 controls the switch circuit 100 to allow the stored voltage VS to discharge to the input voltage source. At this time, as shown in FIG. 3, the mode switching signal MD is at a high level, which represents that the power failure prevention system is in the boost mode. The charge/discharge instructing signal CR is at a low level, which represents that (the load of) the power failure prevention system is releasing energy.

As shown in FIG. 7, in the process of discharging the stored voltage VS to the input voltage source, when the input voltage VIN is higher than the stored voltage VS, and the difference between the stored voltage VS and the input voltage VIN is higher than the second difference threshold (that is, the stored voltage VS is much lower than the input voltage VIN), the control circuit 400 controls the switch circuit 100 to operate in the buck mode of the fourth stage process step 4 shown in FIG. 7. In the buck mode of the fourth stage process step 4, the control circuit 400 turns on the third switch Q3, turns off the fourth switch Q4, and complementarily switches the first switch Q1 and the second switch Q2 according to the duty ratio of the input voltage Vin to the stored voltage VS. As a result, the input voltage Vin of the input voltage source is allowed to start charging the stored voltage VS of the energy storage circuit 200 through the inductor L.

In the fifth stage program step 5 shown in FIG. 8, a total power of the power failure prevention system is normally or abnormally turned off, so that the first to fourth switches Q1 to Q4 of the switching circuit 100 are turned off. In the sixth stage program step 6 shown in FIG. 8, when the power failure prevention system is powered on such that the input voltage Vin such as 5V of the input voltage source is restored, the energy storage circuit 200 may be charged by the input voltage source again.

In summary, the present disclosure provides the power failure prevention system, which can perform a bi-directional operation of charging and discharging in the buck mode, the buck-boost mode and the boost mode. In particular, when the storage voltage of the energy storage circuit is lower than the input voltage of the input voltage source, the input voltage still can be maintained. When the input voltage source can normally supply power, the input voltage source charges the energy storage circuit used as the backup power supply device. When the power is abnormally powered down in any of the above-mentioned modes, the energy storage circuit is used to provide the stored voltage to the input voltage source such that the input voltage source can supply the power to circuit components. In particular, the power is supplied to the circuit components that are executing programs when the power is abnormally powered down. For example, the power is supplied to a solid state storage device that is accessing data when the power is abnormally powered down. As a result, the circuit components obtaining the backup power can use the stored voltage to execute unfinished programs. Therefore, the power failure prevention system of the present disclosure can prevent a power failure from causing errors in the programs. When no error occurs in the programs, the programs do not need to be re-executed after a period of time when the power is finally restored.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power failure prevention system, comprising:
   a switch circuit including a first switch, a second switch, a third switch and a fourth switch, wherein a first terminal of the first switch is connected to an input voltage source, a second terminal of the first switch is connected to a first terminal of the second switch, a second terminal of the second switch is grounded, and a node between the first switch and the second switch is connected to a node between the third switch and the fourth switch through an inductor;
   an energy storage circuit connected to a first terminal of the third switch, wherein a second terminal of the third switch is connected to a first terminal of the fourth switch, and a second terminal of the fourth switch is grounded;
   a voltage detector circuit connected to the input voltage source and the energy storage circuit and configured to detect an input voltage provided by the input voltage source and a stored voltage of the energy storage circuit; and
   a control circuit connected to the voltage detector circuit and control terminals of the switch circuit, and configured to switch the switch circuit between a plurality of modes including a buck mode, a buck-boost mode and a boost mode according to the input voltage and the stored voltage;
   wherein in each of the modes, when the input voltage is higher than a first threshold, the switch circuit allows the input voltage to charge the energy storage circuit;
   wherein in each of the modes, when the input voltage is lower than a second threshold, the switch circuit allows the stored voltage to discharge to the input voltage source;
   wherein the first threshold is higher than the second threshold.

2. The power failure prevention system according to claim 1, wherein in a process of discharging the stored voltage to the input voltage source, when the stored voltage is higher than the input voltage and a difference between the stored voltage and the input voltage is higher than a first difference threshold, the control circuit controls the switch circuit to operate in the buck mode;
   wherein in the buck mode, the control circuit turns on the first switch, turns off the second switch, and complementarily switches the third switch and the fourth switch according to a duty ratio of the input voltage to the stored voltage.

3. The power failure prevention system according to claim 2, wherein in the process of discharging the stored voltage to the input voltage source, when the stored voltage is higher than, equal to or lower than the input voltage, and the difference between the stored voltage and the input voltage is lower than the first difference threshold and lower than a second difference threshold, the control circuit controls the switch circuit to operate in the buck-boost mode;

wherein in the buck-boost mode, the control circuit complementarily switches the first switch, the second switch, the third switch and the fourth switch according to the duty ratio of the input voltage to the stored voltage.

4. The power failure prevention system according to claim 3, wherein in the process of discharging the stored voltage to the input voltage source, when the input voltage is higher than the stored voltage and the difference between the stored voltage and the input voltage is higher than the second difference threshold, the control circuit controls the switch circuit to operate in the boost mode;

wherein in the boost mode, the control circuit turns on the third switch, turns off the fourth switch, and complementarily switches the first switch and the second switch according to the duty ratio of the input voltage to the stored voltage.

5. The power failure prevention system according to claim 1, wherein in a process of charging the energy storage circuit by the input voltage, when the input voltage is lower than the stored voltage, and a difference between the stored voltage and the input voltage is higher than a first difference threshold, the control circuit controls the switch circuit to operate in the boost mode;

wherein in the boost mode, the control circuit turns on the third switch, turns off the fourth switch, and complementarily switches the first switch and the second switch according to a duty ratio of the input voltage to the stored voltage.

6. The power failure prevention system according to claim 5, wherein in the process of charging the energy storage circuit by the input voltage, when the input voltage is higher than, equal to or lower than the stored voltage, and the difference between the stored voltage and the input voltage is lower than the first difference threshold and lower than a second difference threshold, the control circuit controls the switch circuit to operate in the buck-boost mode;

wherein in the buck-boost mode, the control circuit complementarily switches the first switch, the second switch, the third switch and the fourth switch according to the duty ratio of the input voltage to the stored voltage.

7. The power failure prevention system according to claim 6, wherein in the process of charging the energy storage circuit by the input voltage, when the input voltage is higher than the stored voltage, and the difference between the stored voltage and the input voltage is higher than the second difference threshold, the control circuit controls the switch circuit to operate in the buck mode;

wherein in the buck mode, the control circuit turns on the first switch, turns off the second switch, and complementarily switches the third switch and the fourth switch according to the duty ratio of the input voltage to the stored voltage.

8. The power failure prevention system according to claim 1, wherein the energy storage circuit includes a plurality of capacitors connected in parallel with each other, one of each of the capacitors is connected to the first terminal of the third switch, and another terminal of each of the capacitors is grounded.

9. The power failure prevention system according to claim 1, further comprising:
an input capacitor connected to a node between the input voltage source and the first terminal of the first switch.

10. The power failure prevention system according to claim 1, further comprising:
a voltage divider circuit connected to the input voltage source and the voltage detector circuit, and configured to divide the input voltage.

11. The power failure prevention system according to claim 1, further comprising:
a voltage divider circuit connected to the first terminal of the third switch and the voltage detector circuit, and configured to divide the stored voltage.

* * * * *